United States Patent
Park

[11] Patent Number: 6,033,970
[45] Date of Patent: Mar. 7, 2000

[54] METHOD FOR FORMING DEVICE-ISOLATING LAYER IN SEMICONDUCTOR DEVICE

[75] Inventor: Jin Won Park, Chungcheongbuk-do, Rep. of Korea

[73] Assignee: LG Semicon Co., Ltd., Cheongju, Rep. of Korea

[21] Appl. No.: 09/103,574

[22] Filed: Jun. 24, 1998

[30] Foreign Application Priority Data

Nov. 6, 1997 [KR] Rep. of Korea ............. 97-58531

[51] Int. Cl.⁷ .................................................. H01L 21/76
[52] U.S. Cl. ..................... 438/435; 438/424; 438/427; 438/437; 148/DIG. 50
[58] Field of Search ........................... 438/424, 427, 438/435, 437, 296

[56] References Cited

U.S. PATENT DOCUMENTS

| | | | |
|---|---|---|---|
| 5,498,565 | 3/1996 | Gocho et al. | 438/427 |
| 5,702,977 | 12/1997 | Jang et al. | 148/DIG. 50 |
| 5,731,241 | 3/1998 | Jang et al. | 438/437 |
| 5,741,740 | 4/1998 | Jang et al. | 438/437 |
| 5,851,899 | 12/1998 | Weigand | 438/427 |
| 5,880,007 | 3/1999 | Varian et al. | 438/427 |

OTHER PUBLICATIONS

Jun. 18–20, 1996 VMIC Conference 1996 ISMIC–106/96/0063(c), "Evaluation of Cyclotene™ 5021 as a Low Dielectric Constantild" pp. 63–68.

Primary Examiner—Trung Dang
Attorney, Agent, or Firm—Fleshner & Kim

[57] ABSTRACT

A method for forming a device-isolating layer of a semiconductor device in which an APCVD oxide layer and an HDPCVD oxide layer are successively deposited to fill trenches. The method includes forming a thermal oxide layer on a semiconductor substrate including active regions and device-isolating regions, forming a nitride layer on the thermal oxide layer, selectively etching the nitride layer to be removed over the device-isolating regions and selectively etching the thermal oxide layer and the semiconductor substrate with the patterned nitride layer serving as a mask to form trenches. The method further includes forming another thermal oxide layer on the surface of the trenches, forming an APCVD oxide layer on the entire surface including the thermal oxide layer and the patterned nitride layer, forming and annealing an HDPCVD oxide layer on the entire surface of the APCVD oxide layer to fill the trenches. The HDPCVD oxide layer is then polished using a CMP process. However, the HDPCVD oxide layer remains in the trenches.

18 Claims, 3 Drawing Sheets

METHOD FOR FORMING DEVICE-ISOLATING LAYER IN SEMICONDUCTOR DEVICE

BACKGROUND OF THE INVENTION

1. Field of the Invention

The present invention relates to a semiconductor device, and more particularly, to a method for forming a device-isolating layer of a semiconductor device.

2. Background of the Related Art

The process for forming device-isolating regions to isolate one cell from another is an important technology for device miniaturization. Much research and continuing development has been directed to forming device-isolating regions.

For a large capacity semiconductor memory the width of device-isolating region is a primary factor to determine on its total size. Local oxidation of silicon is a method for forming a device-isolating region. In this method, however, a bird's beak is generated so that the device reliability becomes poor. As methods improved from local oxidation of silicon, side wall masked isolation (SWAMI) and selective polysilicon oxidation (SEPOX) are suggested.

A related art method of shallow trench isolation (STI), in which grooves are formed in a substrate and an insulator is buried in the grooves is another suggested method. In the STI method, a trench is formed in a substrate, and an insulator is buried in the trench to form a device-isolating layer. Initially, a plasma oxide film or an undoped silicate glass (USG) film formed by an atmospheric pressure chemical vapor deposition (APVCD) is used to be buried in a tench as the isolating-layer. Another suggested related art method uses a high density plasma chemical deposition (HDPCVD) oxide film to bury a trench as the size of devices is decreased.

Related art methods for forming a device-isolating layer will be described with reference to FIGS. 1A to 2B. FIGS. 1A to 1B are cross-sectional views showing process steps of a related art method for forming a device-isolating layer in a semiconductor device.

As shown in FIGS. 1A and 1B, an APCVD oxide layer is used to bury a trench. Referring to FIG. 1A, a nitride layer 3 is formed on a thermal oxide layer 2 on a semiconductor substrate 1 and the nitride layer 3 is selectively etched. With the patterned nitride layer 3 serving as a mask, a thermal oxidation process is performed to form the thermal oxide layer 2. The nitride layer 3 is then selectively etched and the substrate 1 is etched to a predetermined depth to form trenches in the substrate 1 in regions to be used as a device-isolating layer.

A plasma oxide layer 4 is formed on the entire surface including the thermal oxide layer 2 and the trench. A USG layer 5 is formed on the plasma oxide layer 4 with an APCVD process. The trench is filled with the USG layer 5. Referring to FIG. 1B, the USG layer 5 and the plasma oxide layer 4 are etched-back to remain only in the trench, thereby forming a device-isolating layer.

In the method using a plasma oxide layer 4 and an USG layer 5, design rule is decreased, and it is difficult to apply this method to mass production. Thus, a second related art method using an oxide layer by an HDPCVD process is preferred and will be described with reference to FIGS. 2A and 2B.

Referring to FIG. 2A, a thermal oxide film 2 is formed on a semiconductor substrate 1, and a nitride layer 3 is formed on the thermal oxide film 2. The nitride layer 3 is selectively etched to be removed over the device-isolating regions. The thermal oxide film 2 and the semiconductor substrate 1 are etched to a predetermined depth to form trenches with the patterned nitride layer 3 serving as a mask. Subsequently, another thermal oxide layer is formed on the surface of the trench and an HDPCVD oxide layer 6 is formed on the entire surface including the trench to fill the trench. Referring to FIG. 2B, the HDPCVD oxide layer 6 is etched-back to remain in the trench, thereby forming device-isolating layers.

Such related art methods for forming device-isolating layers have various problems. If an APCVD oxide film is used to fill a trench, voids are generated at a narrow portion of the width of a device-isolating layer by physical characteristic of an APCVD oxide film, which deteriorates a device isolation characteristic. At a wide portion of the width of an APCVD oxide film device-isolating layer, dishing is so severe that an additional process is needed to compensate for the dishing defect. If an HDPCVD oxide film is used to fill trenches, plasma damage generated by sputter etching causes leakage current, which deteriorates the characteristic of device isolation.

The above references are incorporated by reference herein where appropriate for appropriate teachings of additional or alternative details, features and/or technical background.

SUMMARY OF THE INVENTION

An object of the present invention is to provide a method for forming a device-isolating layer in a semiconductor device that substantially obviates one or more of problems caused by limitations and disadvantages of the related art.

Another object of the invention is to provide a method for forming a device-isolating layer of a semiconductor device that improves the characteristic of device isolation.

Another object of the invention is to provide a method for forming a device-isolating layer of a semiconductor device that reduces a dishing effect in a device-isolating layer.

Another object of the invention is to provide a method for forming a device-isolating layer of a semiconductor device that reduces leakage current in a device-isolating layer.

Another object of the invention is to provide a method for forming a device-isolating layer of a semiconductor device that by successive depositions of insulating layers that improve device isolation characteristics.

Another object of the invention is to provide a method for forming a device-isolating layer of a semiconductor device in which an APCVD oxide layer and an HDPCVD oxide layer are successively deposited with an STI process to bury trenches.

To achieve these and other advantages in a whole or in parts and in accordance with the present invention, as embodied and broadly described, a method for forming a device-isolating layer in a semiconductor device includes the steps of forming a first thermal oxide layer on a semiconductor substrate, forming a nitride layer on the first thermal oxide layer, selectively removing the nitride layer over device-isolating regions, selectively removing the thermal oxide layer and the semiconductor substrate with the patterned nitride layer serving as a mask to form trenches, forming a second thermal oxide layer on a surface of the trenches, forming an APCVD oxide layer on the second thermal oxide layer and the patterned nitride layer and forming an HDPCVD oxide layer on the APCVD oxide layer to fill the trenches.

To further achieve these and other advantages in a whole or in parts and in accordance with the present invention, as embodied and broadly described, a method for forming a device-isolating layer in a semiconductor device includes forming trenches in a semiconductor substrate, forming an APCVD oxide layer on the trenches, and forming an HDPCVD oxide layer on the APCVD oxide layer to fill the trenches.

To further achieve these and other advantages in a whole or in parts and in accordance with the present invention, as embodied and broadly described, a method for forming a device-isolating layer in a semiconductor device includes selectively etching a semiconductor substrate to form trenches, forming a LPCVD oxide film on the trenches, and forming an HDPCVD oxide film on the LPCVD oxide film to fill the trenches.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1A:
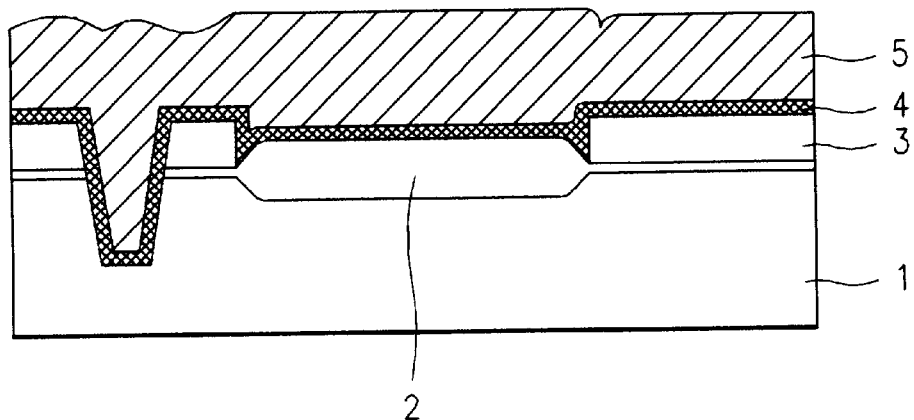
FIGS. 1A and 1B are cross-sectional diagrams showing process steps of a related method for forming a device-isolating layer in a semiconductor device.
Figure 1B:
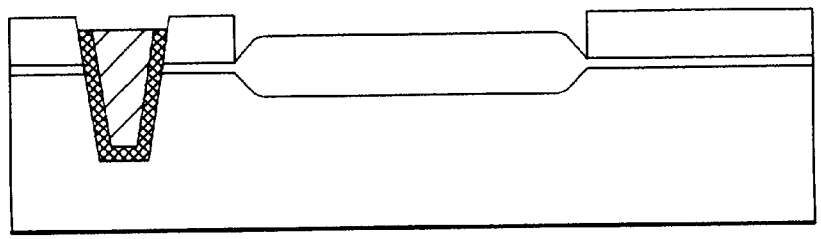
Figure 2A:
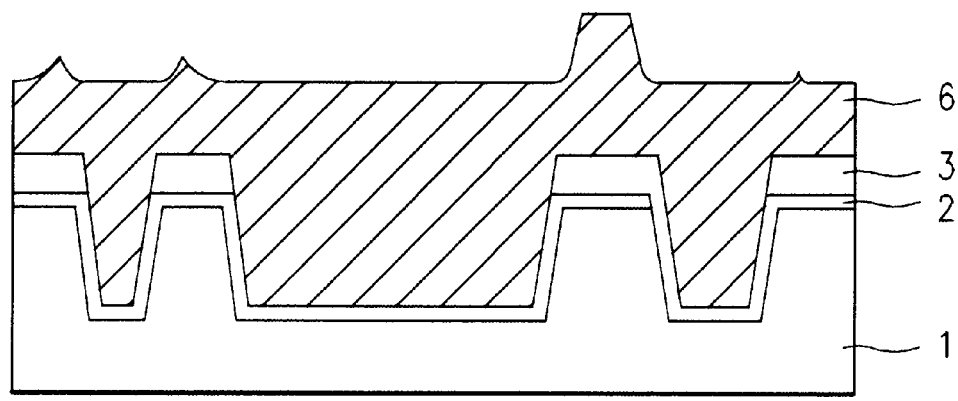
FIGS. 2A and 2B are cross-sectional diagrams showing process steps of another related art method for forming a device-isolating layer in a semiconductor device.
Figure 2B:
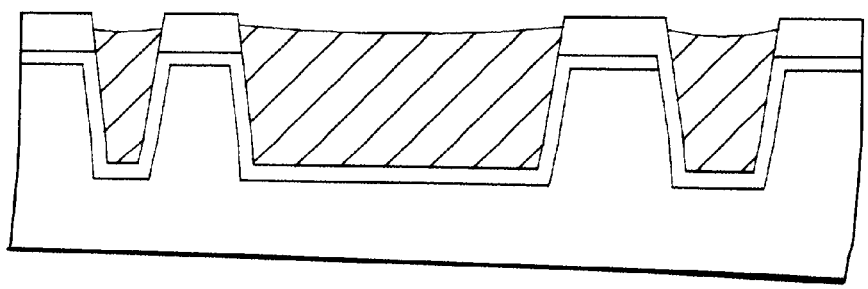
Figure 3A:
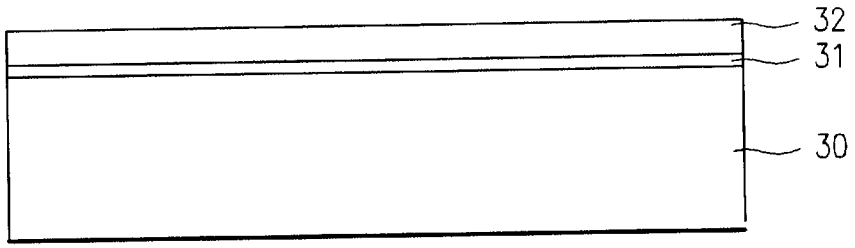
FIGS. 3A and 3D are cross-sectional diagrams showing a preferred embodiment of method for forming a device-isolating layer in a semiconductor device according to the present invention.
Figure 3B:
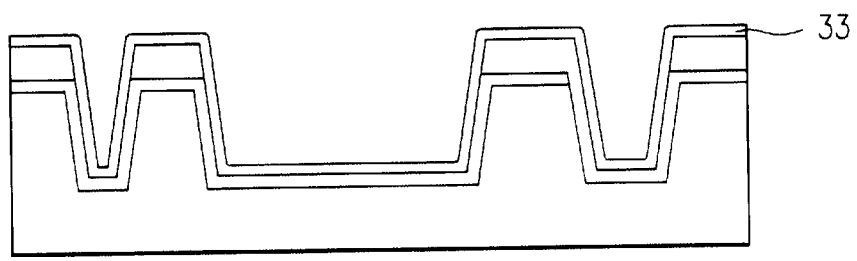
Figure 3C:
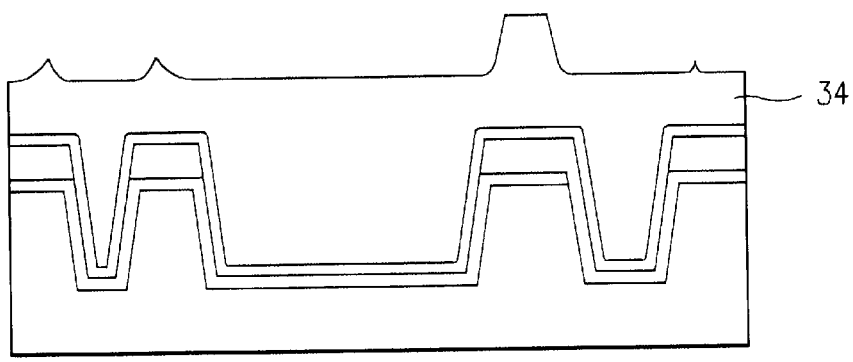
Figure 3D:
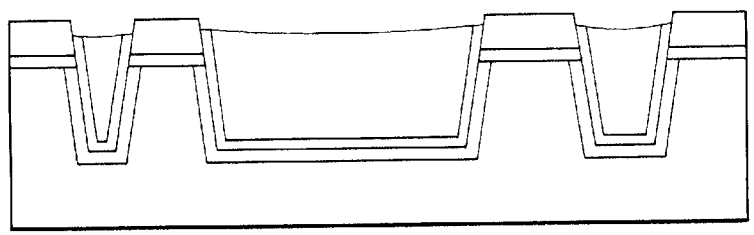

FIGS. 3A and 3D are cross-sectional views showing process steps of a method for forming a device-isolating layer in a semiconductor device according to an embodiment of the present invention. As shown in FIGS. 3A, a thermal oxide layer 31 is formed on the surface of the semiconductor substrate 30 that will include active regions and device-isolating regions that isolate one active region from another. A nitride layer 32 is formed on the thermal oxide layer 31 preferably with a low pressure chemical vapor deposition (LPCVD) process.

Referring to FIG. 3B, the nitride layer 32 is selectively etched, for example, to be removed over the device-isolating regions. With the patterned nitride layer 32 serving as a mask, the thermal oxide layer 31 and the semiconductor substrate 30 are selectively etched, for example, to form trenches of a predetermined depth. At this time, a reactive ion etching (RIE) process is preferably performed to etch the thermal oxide 31 and the semiconductor substrate 30 to slope sides of the trenches approximately 80–88°. Thereafter, a thermal oxidation process is preferably performed to form a thermal oxide layer approximately 50–100 Angstrom thick. An APCVD oxide layer 33 (or an LPCVD oxide layer) is formed on the entire surface including the patterned nitride layer 32 and the thermal oxide layer. The APCVD oxide layer 33 (or the LPCVD oxide layer) is preferably an undoped oxide film approximately 200–500 Angstrom thick.

Referring to FIG. 3C, an HDPCVD oxide layer 34 is preferably formed on the entire surface of the APCVD oxide layer 33 approximately 5000–8000 Angstrom thick. The HDPCVD oxide layer 33 is preferably annealed at a temperature of about 900–1000° C. in an atmosphere of $N_2$. The HDPCVD oxide layer 34 is an undoped oxide film and the HDP source includes inductively coupled plasma (ICP), helicon plasma, electron cyclotron resonance (ECR) or the like. The depositing ratio/the sputtering ratio in forming the HDPCVD oxide layer 34 is preferably about 2.9–3.9.

Referring to FIG. 3D, the HDPCVD oxide layer 34 is removed or polished preferably with a chemical mechanical polishing (CMP) process to fill the trenches and complete the device isolation layer. Thus, the CMP process preferably exposes the nitride layer 32 while leaving the two oxide layers to fill the trenches.

In the method according to the preferred embodiment, an APCVD oxide layer (or an LPCVD oxide layer) is used as a buffer layer to improve the characteristic of device isolation. Further, an HDPCVD oxide 34 is used, which has a good burying characteristic, even in wide width device-isolating regions.

The method for forming a device-isolating layer in a semiconductor device according to the preferred embodiment of the present invention has various advantages. Since an APCVD oxide layer (or an LPCVD oxide layer) is used as a buffer, the generation of leakage current is reduced and the characteristic of device isolation is improved. Further, an HDPCVD oxide film having a good burying characteristic at a wide region is used to bury a trench, so that a defect such as a dishing is decreased to improve the characteristic of device isolation.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures. For example, although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed is:

1. A method for forming a device-isolating layer in a semiconductor device comprising the steps of:

forming a first oxide layer on a semiconductor substrate;

selecting forming a patterning layer on the first oxide layer to expose device-isolating regions;

selectively removing the first oxide layer and the semiconductor substrate to form trenches with the patterning layer serving as a mask;

forming a second oxide layer on a surface of the trenches;

forming an APCVD oxide layer on the second oxide layer and the patterned nitride layer; and forming an HDPCVD oxide layer on the APCVD oxide layer to fill the trenches.

2. The method of claim 1, further comprising;

annealing the HDPCVD oxide layer; and removing the HDPCVD oxide layer and the APCVD oxide layer to expose the nitride layer while the HDPCVD layer remains in the trenches.

3. The method of claim 2, wherein the forming a patterning layer step uses an LPCVD process, and wherein the removing an HDPCVD oxide layer step uses a CMP process.

4. The method of claim 1, wherein a reactive ion etching process forms the trenches with a slope on sides of the trenches being approximately 80–88° C.

5. The method of claim 1, wherein selectively forming a patterning layer step comprises:

forming a nitride layer on the first oxide layer as the patterning layer; and selectively removing the nitride layer over the device-isolating regions.

6. The method of claim 1, wherein the first oxide layer is formed over active regions and the device-isolating regions, and wherein the second oxide layer is formed with a thermal oxidation process to be approximately 50–100 Angstroms thick, and wherein the APCVD oxide layer is an undoped oxide film approximately 200–500 Angstroms thick.

7. The method of claim 1, wherein a LPCVD oxide layer is formed instead of the APCVD oxide layer.

8. The method of claim 7, wherein the LPCVD oxide layer is an undoped oxide film approximately 200–500 Angstroms thick.

9. The method of claim 1, wherein the HDPCVD oxide layer is an undoped layer approximately 5000–8000 Angstroms thick, and wherein the HDPCVD oxide layer is annealed in a substantially $N_2$ atmosphere at a temperature of approximately 900–1000° C.

10. The method of claim 1, wherein an HDP source to form the HDPCVD oxide layer is at least one of ICP, helicon plasma and ECR, and wherein a depositing ratio is approximately 2.9–3.9.

11. A method for forming a device-isolating layer in semiconductor device, comprising:

forming trenches in a semiconductor substrate;

forming an APCVD oxide layer on the trenches; and forming an HDPCVD oxide layer on the APCVD oxide layer to fill the trenches.

12. The method of claim 11, further comprising:

forming a thermal oxide layer directly on the trenches approximately 50–100 Angstroms thick with a thermal oxidation process; and polishing the HDPCVD oxide layer using a CMP process.

13. The method of claim 11, wherein the APCVD oxide layer is an undoped oxide film approximately 200–500 Angstroms thick.

14. The method of claim 11, wherein the HDPCVD oxide layer is an undoped oxide film approximately 5000–8000 Angstroms thick, and wherein the HDPCVD oxide layer is annealed in a substantially $N_2$ atmosphere at a temperature of 900–1000° C.

15. The method of claim 11, wherein the APCVD oxide layer and the HDPCVD oxide layer are successively deposited using an STI process.

16. A method for forming a device-isolating layer in a semiconductor device comprising the steps of:

selectively etching a semiconductor substrate to form trenches;

forming an LPCVD oxide film on the trenches; and forming an HDPCVD oxide film on the LPCVD oxide film to fill the trenches.

17. The method of claim 16, wherein the LPCVD oxide layer is an undoped oxide film approximately 200–500 Angstroms thick.

18. The method of claim 16, wherein the HDPCVD oxide film is formed of an undoped oxide film approximately 5000–8000 Angstroms thick, and wherein the HDPCVD oxide layer anneals in an atmosphere of $N_2$ at a temperature of 900–1000° C.

* * * * *